United States Patent
Hsieh

(10) Patent No.: US 10,103,191 B2
(45) Date of Patent: Oct. 16, 2018

(54) SEMICONDUCTOR DIE AND METHOD OF PACKAGING MULTI-DIE WITH IMAGE SENSOR

(71) Applicant: SEMICONDUCTOR COMPONENTS INDUSTRIES, LLC, Phoenix, AZ (US)

(72) Inventor: Yu-Te Hsieh, Taoyuan (TW)

(73) Assignee: Semiconductor Components Industries, LLC, Phoenix, AZ (US)

(*) Notice: Subject to any disclaimer, the term of this patent is extended or adjusted under 35 U.S.C. 154(b) by 0 days.

(21) Appl. No.: 15/407,224

(22) Filed: Jan. 16, 2017

(65) Prior Publication Data

US 2018/0204866 A1 Jul. 19, 2018

(51) Int. Cl.
*H01L 31/0203* (2014.01)
*H01L 27/146* (2006.01)

(52) U.S. Cl.
CPC .... *H01L 27/14634* (2013.01); *H01L 27/1469* (2013.01); *H01L 27/14618* (2013.01); *H01L 27/14632* (2013.01); *H01L 27/14636* (2013.01); *H01L 27/14687* (2013.01); *H01L 27/14698* (2013.01)

(58) Field of Classification Search
CPC .......... H01L 27/14634; H01L 27/1469; H01L 27/14698; H01L 27/14632; H01L 27/14687; H01L 27/14618; H01L 27/14636

See application file for complete search history.

(56) References Cited

U.S. PATENT DOCUMENTS

| 2007/0054419 | A1  | 3/2007  | Paik et al. |
| 2008/0191335 | A1* | 8/2008  | Yang ................. H01L 27/14618 257/680 |
| 2008/0217715 | A1  | 9/2008  | Park et al. |
| 2008/0308928 | A1* | 12/2008 | Chang ................. H01L 25/0657 257/723 |
| 2010/0032830 | A1* | 2/2010  | Chang ............... H01L 21/76898 257/737 |
| 2012/0313209 | A1* | 12/2012 | Oganesian ........ H01L 27/14618 257/443 |
| 2013/0221452 | A1* | 8/2013  | Strothmann ............ H01L 24/20 257/414 |

(Continued)

*Primary Examiner* — Victor A Mandala
(74) *Attorney, Agent, or Firm* — IPTechLaw

(57) ABSTRACT

A semiconductor wafer has an image sensor area with a light transmissive wafer, such as glass, disposed over the semiconductor wafer. A portion of the semiconductor wafer is removed to thin the wafer. A semiconductor die is disposed over a surface of the semiconductor wafer opposite the light transmissive wafer. An encapsulant is deposited around the semiconductor die. A portion of the encapsulant is removed to planarize the encapsulant. A conductive via is formed through the semiconductor wafer and first encapsulant. An interconnect structure is formed over the encapsulant and semiconductor die. The interconnect structure includes multiple insulating layers and multiple conductive layers. The multiple insulating layers can be an encapsulant. The semiconductor wafer is singulated to form a multi-die semiconductor package, which integrates the image sensor semiconductor die with other types of semiconductor die to enhance the image performance within the multi-die package.

6 Claims, 10 Drawing Sheets

(56) References Cited

U.S. PATENT DOCUMENTS

| | | | |
|---|---|---|---|
| 2015/0318323 A1* | 11/2015 | Borthakur | H01L 27/14623 348/273 |
| 2016/0088243 A1* | 3/2016 | Higashi | H01L 27/14612 348/294 |
| 2016/0172402 A1* | 6/2016 | Katkar | H01L 27/1464 257/292 |
| 2017/0018590 A1* | 1/2017 | Yiu | H01L 27/14634 |
| 2017/0213864 A1* | 7/2017 | Chen | H01L 23/544 |
| 2017/0213920 A1* | 7/2017 | Takahashi | H01L 21/76898 |

* cited by examiner

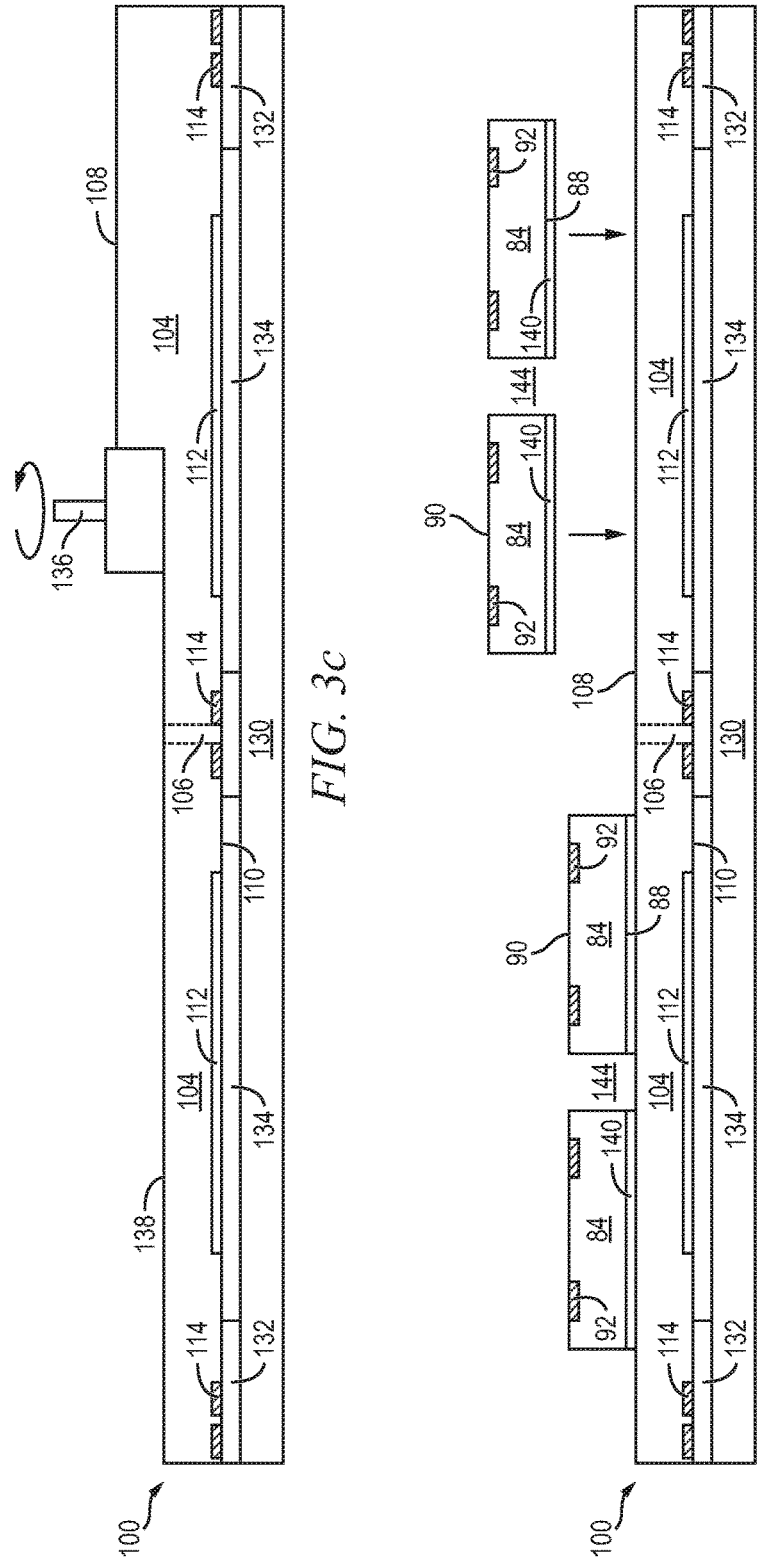

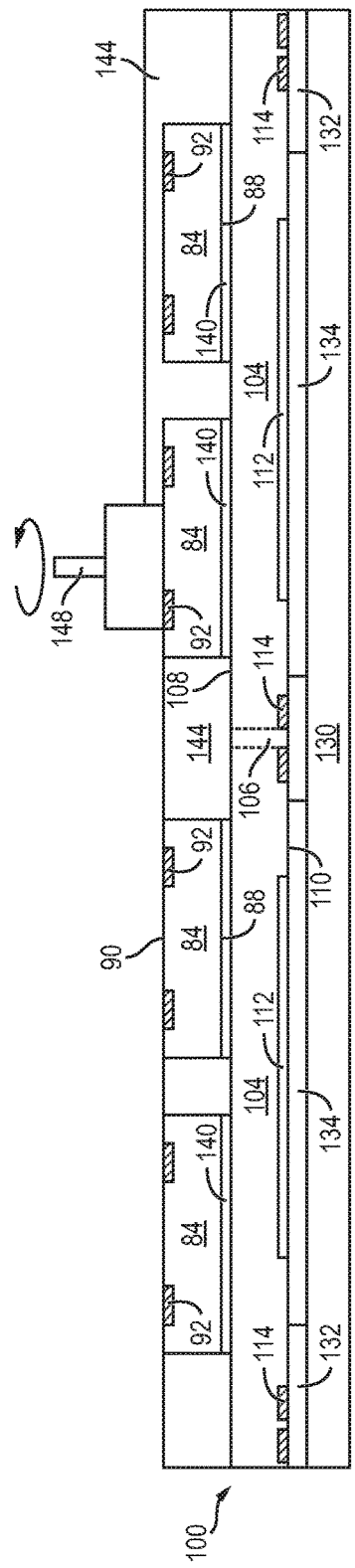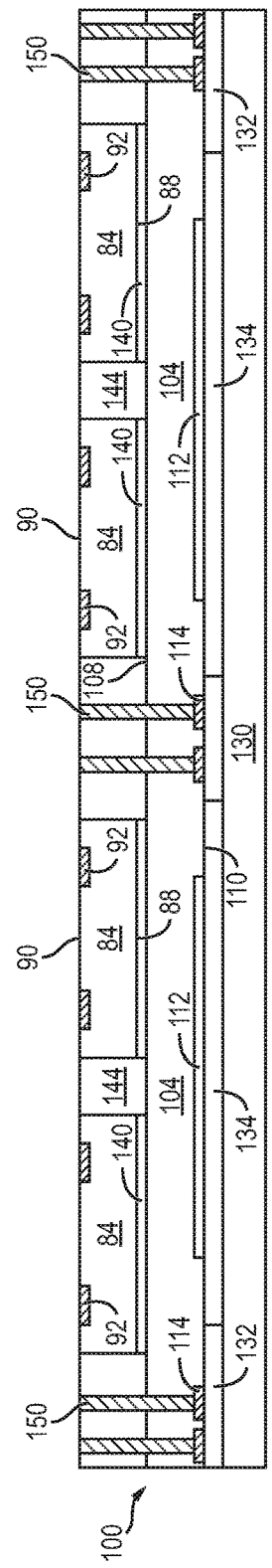

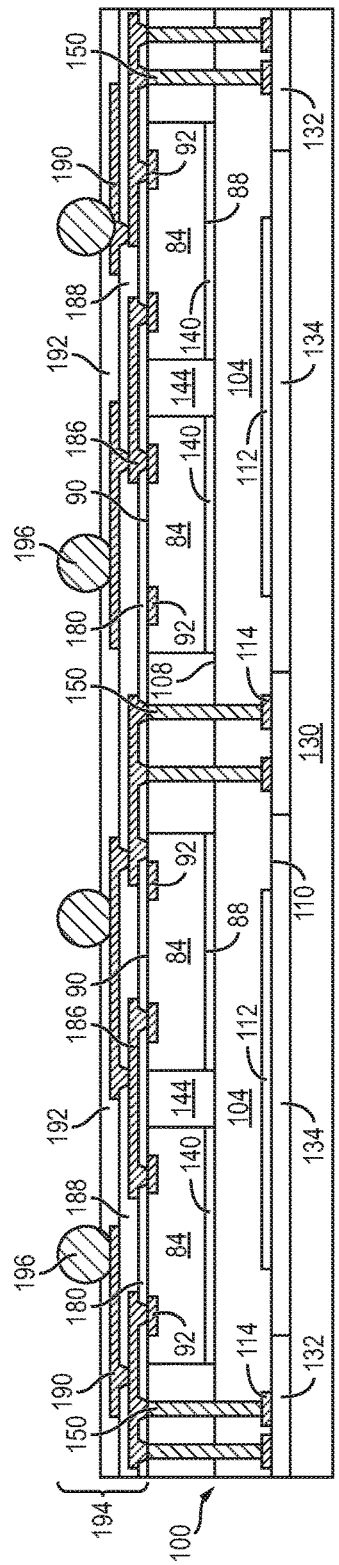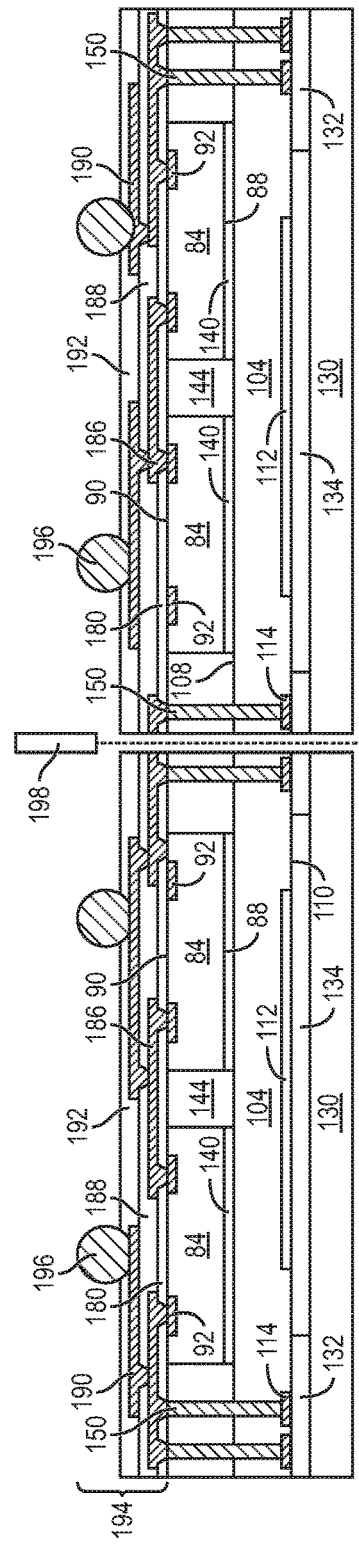
FIG. 4a
FIG. 4b

SEMICONDUCTOR DIE AND METHOD OF PACKAGING MULTI-DIE WITH IMAGE SENSOR

FIELD OF THE INVENTION

The present invention relates in general to semiconductor devices and, more particularly, to a semiconductor device and method of packaging multi-die including an image sensor.

BACKGROUND

Semiconductor devices are commonly found in modern electronic products. Semiconductor devices vary in the number and density of electrical components. Semiconductor devices perform a wide range of functions such as analog and digital signal processing, sensors, transmitting and receiving electromagnetic signals, controlling electronic devices, power management, and audio/video signal processing. Discrete semiconductor devices generally contain one type of electrical component, e.g., light emitting diode (LED), small signal transistor, resistor, capacitor, inductor, diodes, rectifiers, thyristors, and power metal-oxide-semiconductor field-effect transistor (MOSFET). Integrated semiconductor devices typically contain hundreds to millions of electrical components. Examples of integrated semiconductor devices include microcontrollers, application specific integrated circuits (ASIC), standard logic, amplifiers, clock management, memory, interface circuits, and various signal processing circuits.

An image sensor is a type of semiconductor device that detects and records an image by converting the variable attenuation of light waves or electromagnetic radiation into electric signals. Image sensors convey information related to an image by communicating signals in response to incident electromagnetic radiation. An image sensor may include an array of imaging pixels. The imaging pixels include photosensitive elements, such as photodiodes, that convert the incoming image light into image signals. A typical image sensor can have hundreds of thousands or millions of pixels. Image sensors use control circuitry to operate the imaging pixels and readout circuitry for reading out image signals corresponding to the electric charge generated by the photosensitive elements.

An image sensor can be implemented with semiconductor charge-coupled devices (CCD) and active pixel sensors in complementary metal-oxide-semiconductor (CMOS) or N-type metal-oxide-semiconductor (NMOS) technologies with applications in electronic devices, such as digital cameras, computers, cellular telephones, video recorders, medical imaging equipment, night vision equipment, thermal imaging devices, radar, sonar, and other image detecting devices that gather incoming image light to capture an image.

In an imaging sensor, each pixel typically includes a photosensitive element such as a photodiode that receives incident photons (light) and converts the photons into electrical signals. The imaging system contains an image sensor die with an image sensor integrated circuit and an array of photodiodes formed in a semiconductor substrate. Alternatively, the imaging system contains an image sensor die having an array of photodiodes formed in a semiconductor substrate and the image sensor die is mounted on a digital signal processor (DSP) die.

A glass layer may be placed over the image sensor for protection. A redistribution layer (RDL) may be formed over a surface of the semiconductor die opposite the glass layer for electrical interconnect. The single RDL limits the interconnect capability of the semiconductor die containing the image sensor.

BRIEF DESCRIPTION OF THE DRAWINGS

FIGS. 3a-3j illustrate a process of forming a multi-die image sensor semiconductor package;

FIGS. 4a-4b illustrate a process of forming a build-up interconnect structure with encapsulant;

DETAILED DESCRIPTION OF THE DRAWINGS

The following describes one or more embodiments with reference to the figures, in which like numerals represent the same or similar elements. While the figures are described in terms of the best mode for achieving certain objectives, the description is intended to cover alternatives, modifications, and equivalents as may be included within the spirit and scope of the disclosure. The term "semiconductor die" as used herein refers to both the singular and plural form of the words, and accordingly, can refer to both a single semiconductor device and multiple semiconductor devices. The term "image sensor" refers both to a sensor associated with an individual pixel, as well as to a sensor associated with a plurality (such as an array) of pixels. The image sensor may include an array of image sensor pixels each of which includes a photodiode and other operational circuitry such as transistors formed in the substrate.

An image sensor uses a pixel to capture light in a given environment and generate an electrical signal representative of an image in the environment. For example, electrical signals generated by the pixel generate a digital image, which is presented as information to a user of an electronic device. In some suitable scenarios, electrical signals generated by the image sensor is processed and used to capture information regarding the light that is received at the image sensor, such as brightness, wavelength, spatial patterning, temporal patterning, polarization, direction, and other suitable characteristics associated with light. Such light characteristics can be modified by a light-emitting or reflecting source to encode information based on the characteristics of the light.

Electronic devices, such as digital cameras, computers, cellular telephones, video recorders, medical imaging equipment, night vision equipment, thermal imaging devices, radar, sonar, and other image detecting devices gather incoming image light to capture an image. The image sensors include arrays of image pixels. The imaging pixels include photosensitive elements, such as photodiodes, that convert the incoming image light into image signals. A typical image sensor can have hundreds of thousands or millions of pixels. Image sensors use control circuitry to operate the imaging pixels and readout circuitry for reading out image signals corresponding to the electric charge generated by the photosensitive elements.

Figure 1A:
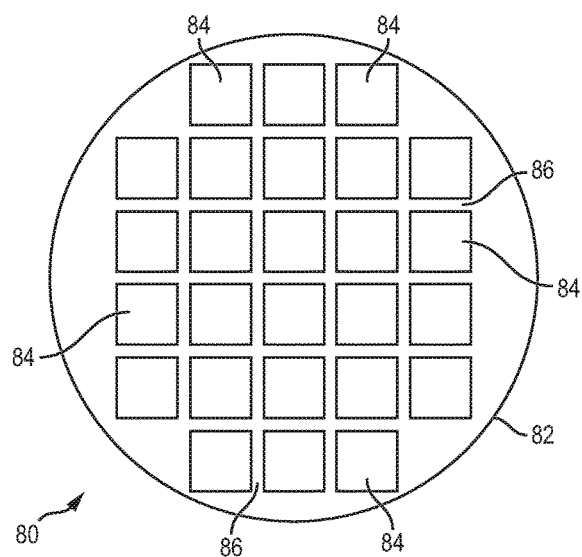
FIGS. 1a-1d illustrate a semiconductor wafer with a plurality of semiconductor die separated by a saw street.

FIG. 1a shows semiconductor wafer 80 with a base substrate material 82, such as silicon, germanium, aluminum phosphide, aluminum arsenide, gallium arsenide, gallium nitride, indium phosphide, silicon carbide, or other bulk semiconductor material for structural support. A plurality of semiconductor die 84 is formed on wafer 80 separated by a non-active, inter-die wafer area or saw street 86. Saw street 86 provides cutting areas to singulate semiconductor wafer 80 into individual semiconductor die 84. In one embodiment, semiconductor wafer 80 has a width or diameter of 100-450 millimeters (mm) and thickness of 50-100 micrometers (μm) or 15-250 μm.

Figure 1B:
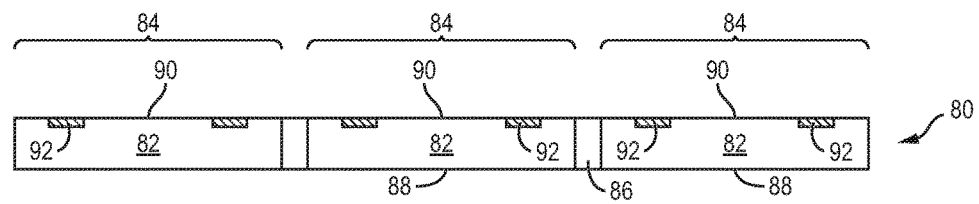

FIG. 1b shows a cross-sectional view of a portion of semiconductor wafer 80. Each semiconductor die 84 has a back or non-active surface 88 and an active surface or region 90 containing analog or digital circuits implemented as active devices, passive devices, conductive layers, and dielectric layers formed within the die and electrically interconnected according to the electrical design and function of the die. Alternatively, surface 88 may be a second active surface, opposite active surface 90, containing analog or digital circuits implemented as active devices, passive devices, conductive layers, and dielectric layers formed within the die and electrically interconnected according to the electrical design and function of the die. For example, the circuits may include one or more transistors, diodes, and other circuit elements formed within active surface or region 90 to implement analog circuits or digital circuits, such as DSP, microcontrollers, ASIC, standard logic, amplifiers, clock management, memory, interface circuits, and other signal processing circuit. Semiconductor die 84 may also contain integrated passive devices (IPDs), such as inductors, capacitors, and resistors, for RF signal processing.

An electrically conductive layer 92 is formed over active surface 90 using PVD, CVD, electrolytic plating, electroless plating process, evaporation, or other suitable metal deposition process. Conductive layer 92 includes one or more layers of aluminum (Al), copper (Cu), tin (Sn), nickel (Ni), gold (Au), silver (Ag), tungsten (W), titanium (Ti), titanium tungsten (TiW), or other suitable electrically conductive material. Conductive layer 92 operates as interconnect pads electrically connected to the circuits on active surface 90.

Semiconductor wafer 80 undergoes electrical testing and inspection as part of a quality control process. Manual visual inspection and automated optical systems are used to perform inspections on semiconductor wafer 80. Software can be used in the automated optical analysis of semiconductor wafer 80. Visual inspection methods may employ equipment such as a scanning electron microscope, high-intensity or ultra-violet light, metallurgical microscope, or optical microscope. Semiconductor wafer 80 is inspected for structural characteristics including warpage, thickness variation, surface particulates, irregularities, cracks, delamination, contamination, and discoloration.

Figure 1C:
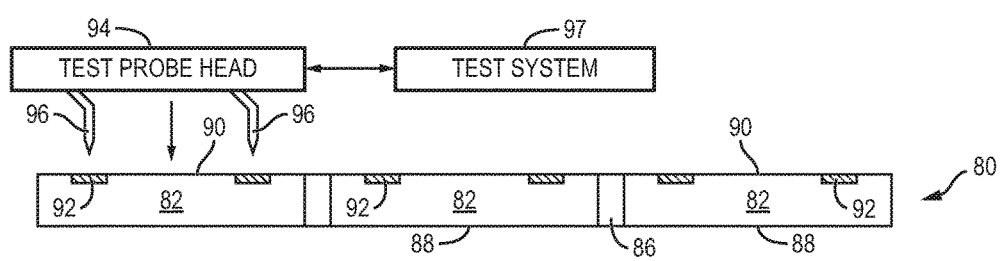

The active and passive components within semiconductor die 84 undergo testing at the wafer level for electrical performance and circuit function. Each semiconductor die 84 is tested for functionality and electrical parameters, as shown in FIG. 1c, using a test probe head 94 including a plurality of probes or test leads 96 or other testing device. Semiconductor die 84 responds to the electrical stimuli, which is measured by computer test system 97 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 80 enables semiconductor die 84 that pass to be designated as known good die for use in a semiconductor package.

Figure 1D:
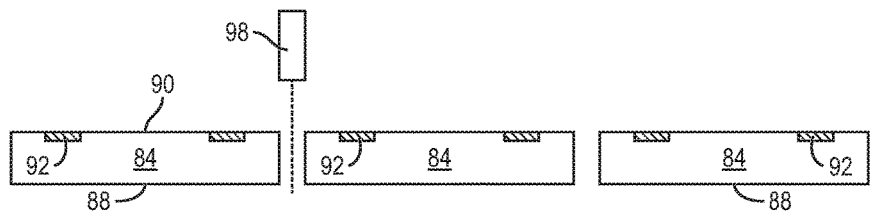

In FIG. 1d, semiconductor wafer 80 is singulated through saw street 86 into individual semiconductor die 84 using saw blade or laser cutting tool 98. Alternatively, semiconductor wafer 80 is singulated using plasma etching, which has advantages of removing base substrate material 82 to form precision surfaces, while retaining the structure and integrity of the base substrate material. In one embodiment, semiconductor die 84 are memory circuits, image sensor processor (ISP), or other controller or signal processor.

Figure 2A:
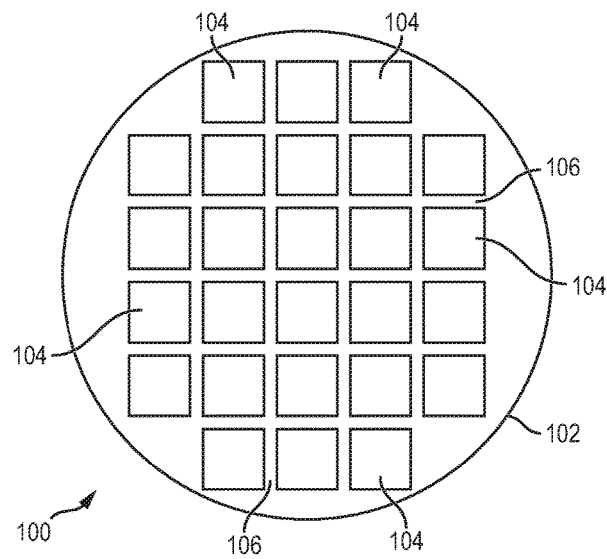
FIGS. 2a-2b illustrate a semiconductor wafer with a plurality of image sensor semiconductor die separated by a saw street.

FIG. 2a shows semiconductor wafer 100 with a base substrate material 102, such as silicon, germanium, aluminum phosphide, aluminum arsenide, gallium arsenide, gallium nitride, indium phosphide, silicon carbide, or other bulk semiconductor material for structural support. A plurality of semiconductor die 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 mm and thickness of 100-250 μm.

Figure 2B:
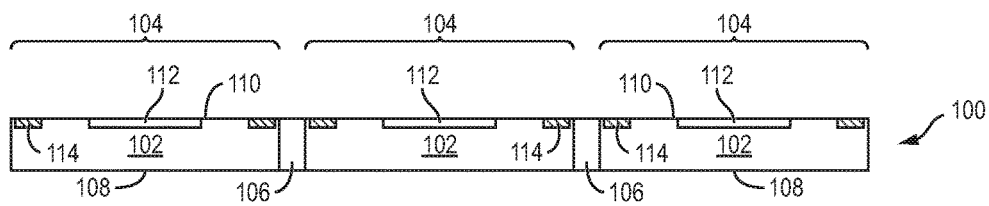

FIG. 2b shows a cross-sectional view of a portion of semiconductor wafer 100. Each semiconductor die 104 has a back or non-active surface 108 and an active surface or region 110 including an image sensor area 112 implemented as CCD and active pixel sensors in CMOS or NMOS technologies. Active surface or region 110 further contains analog or digital circuits implemented as active devices, passive devices, conductive layers, and dielectric layers formed within the die and electrically interconnected according to the electrical design and function of the die.

An electrically conductive layer 114 is formed over active surface 110 using PVD, CVD, electrolytic plating, electroless plating process, evaporation, or other suitable metal deposition process. Conductive layer 114 includes one or more layers of Al, Cu, Sn, Ni, Au, Ag, W, Ti, TiW, or other suitable electrically conductive material. Conductive layer 114 operates as interconnect pads electrically connected to image sensor area 112 and the circuits on active surface 110.

Semiconductor wafer 100 undergoes electrical testing and inspection as part of a quality control process, similar to semiconductor wafer 80. The inspection and electrical testing of semiconductor wafer 100 enables semiconductor die 104 that pass to be designated as known good die for use in a semiconductor package.

Figure 3A:
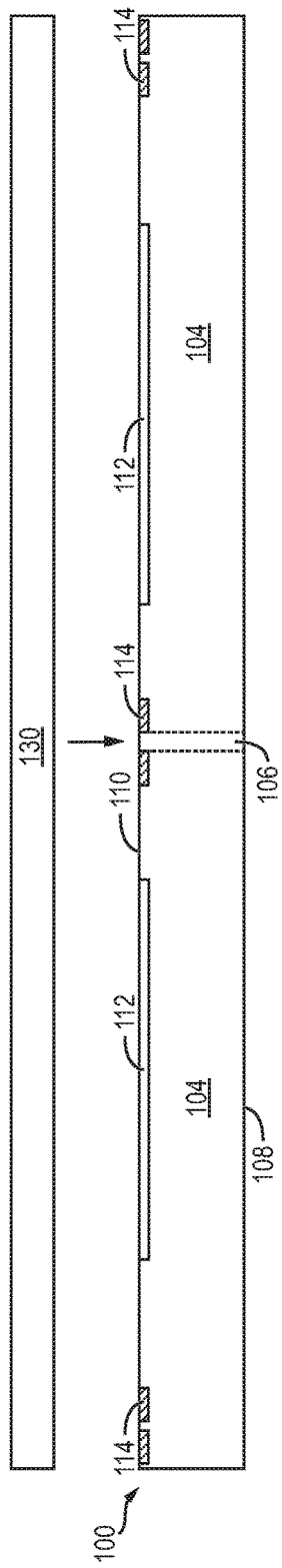
Figure 3B:
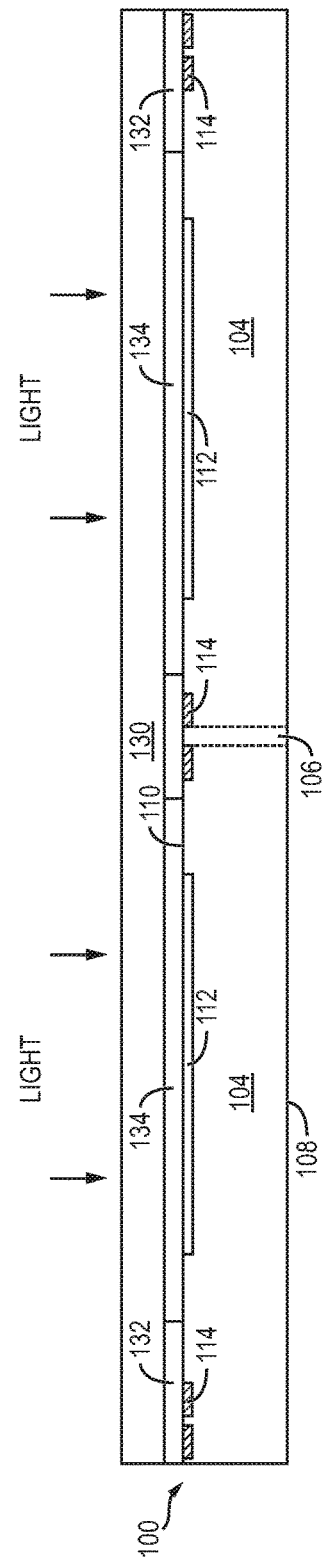

FIGS. 3a-3j illustrate a process of forming a multi-die image sensor semiconductor package. In FIG. 3a, a light transmissive wafer 130 is positioned over and aligned with semiconductor wafer 100. In one embodiment, light transmissive wafer 130 is made of glass or other optically transparent or translucent material. FIG. 3b shows light transmissive wafer 130 disposed over semiconductor wafer 100 with adhesive material 132, such as dry film or epoxy resin, while leaving space or gap 134 between semiconductor wafer 100 and light transmissive wafer 130. Light transmissive wafer 130 passes light to image sensor area 112.

In FIG. 3c, semiconductor wafer 100 is inverted and a portion of back surface 108 is removed by grinder 136 in a backgrinding operation. The backgrinding operation reduces a thickness of base substrate material 102 to surface 138 of the base substrate material. In one embodiment, semiconductor wafer 100 has a post-grinding thickness of 50-100 µm.

Figure 3E:
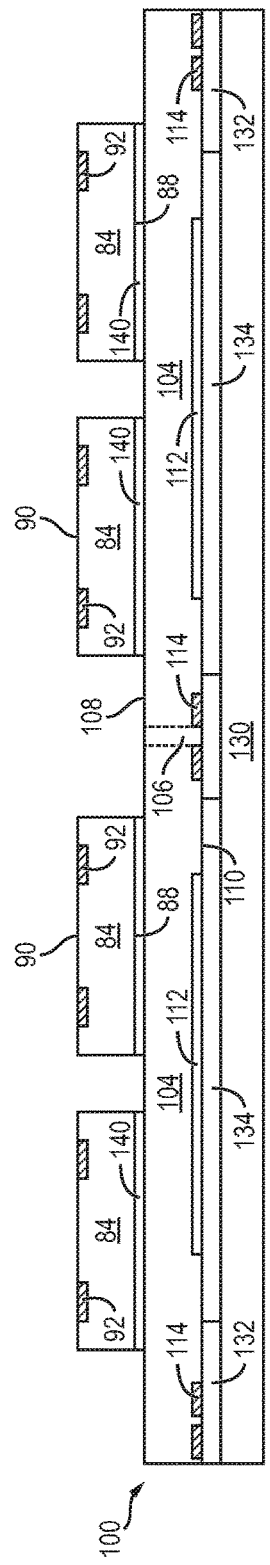

In FIG. 3d, the individual semiconductor die 84 from FIGS. 1a-1d are positioned over semiconductor wafer 100 using a pick and place operation with surface 88 oriented toward back surface 108. FIG. 3e shows semiconductor die 84 bonded to surface 108 with die attach adhesive 140, such as epoxy resin.

Figure 3F:
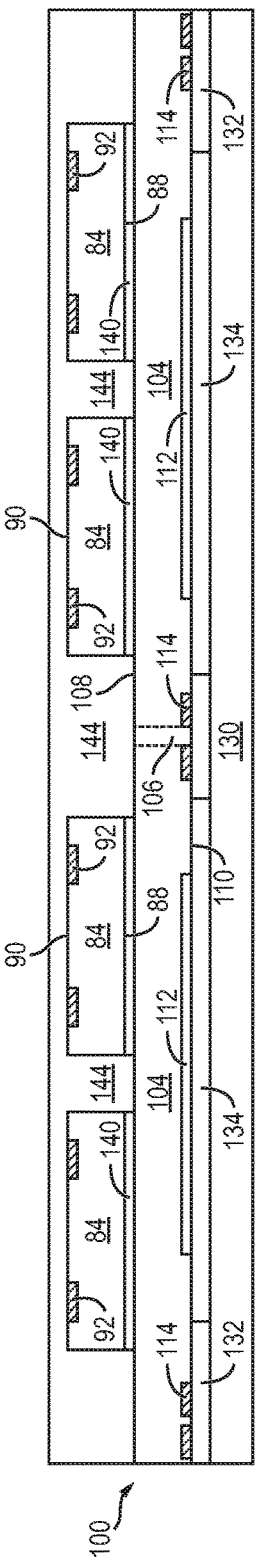

In FIG. 3f, an encapsulant or molding compound 144 is deposited over semiconductor wafer 100 and semiconductor die 84 as an insulating material using a compressive molding, transfer molding, liquid encapsulant molding, vacuum lamination, spin coating, or other suitable applicator. In particular, encapsulant 144 covers side surfaces of semiconductor die 84. Encapsulant 144 can be polymer composite material, such as epoxy resin with filler, epoxy acrylate with filler, or polymer with proper filler. Encapsulant 144 is non-conductive and environmentally protects the semiconductor device from external elements and contaminants. Encapsulant 144 also protects semiconductor die 84 from degradation due to exposure to light.

In FIG. 3g, a portion of encapsulant 144 is removed by grinder 148 in a backgrinding operation. The backgrinding operation planarizes encapsulant 144 with semiconductor die 84.

In FIG. 3h, a plurality of vias is formed through encapsulant 144 and semiconductor wafer 100 using mechanical drilling, laser drilling, or deep reactive ion etching (DRIE). The vias are filled with Al, Cu, Sn, Ni, Au, Ag, W, Ti, TiW, poly-silicon, or other suitable electrically conductive material using electrolytic plating, electroless plating process, or other suitable metal deposition process to form z-direction conductive through silicon vias (TSV) 150 embedded within encapsulant 144 and semiconductor wafer 100 outside image sensor area 112. TSV 150 are electrically connected to image sensor area 112 and the conductive layers and circuits on active surface 110 of semiconductor die 104.

Figure 3I:
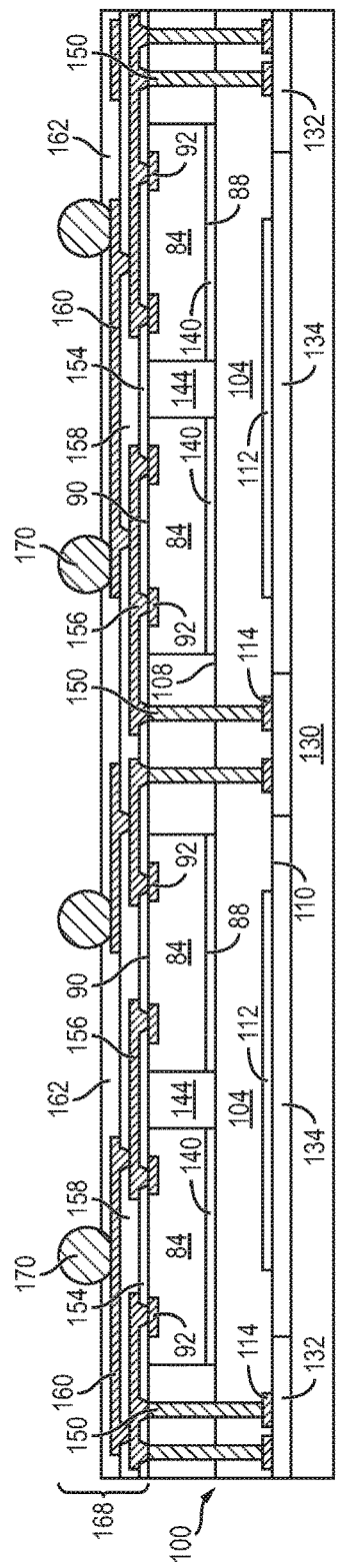

In FIG. 3i, an insulating or passivation layer 154 is formed over encapsulant 144 and active surface 90 using PVD, CVD, printing, lamination, spin coating or spray coating. Insulating layer 154 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBC)), polymer, or other material having similar insulating and structural properties. A portion of insulating layer 154 is removed by etching or laser direct ablation (LDA) to expose TSV 150 and conductive layer 92 on active surface 90.

An electrically conductive layer 156 is formed on insulating layer 154 using PVD, CVD, electrolytic plating, electroless plating process, evaporation, or other suitable metal deposition process. Conductive layer 156 includes one or more layers of Al, Cu, Sn, Ni, Au, Ag, Ti, TiW, or other suitable electrically conductive material. Conductive layer 156 operates as a first RDL for routing electrical signals from conductive layer 92 through TSV 150 to image sensor area 112 and the circuits on active surface 110 and active surface 90, as well as external to the package.

An insulating or passivation layer 158 is formed over insulating layer 154 and conductive layer 156 using PVD, CVD, printing, lamination, spin coating or spray coating. Insulating layer 158 contains one or more layers of SiO2, Si3N4, SiON, Ta2O5, Al2O3, solder resist, polyimide, BCB, PBO, polymer, or other material having similar insulating and structural properties. A portion of insulating layer 158 is removed by etching or LDA to expose conductive layer 156.

An electrically conductive layer 160 is formed on insulating layer 158 using PVD, CVD, electrolytic plating, electroless plating process, evaporation, or other suitable metal deposition process. Conductive layer 160 includes one or more layers of Al, Cu, Sn, Ni, Au, Ag, Ti, TiW, or other suitable electrically conductive material. Conductive layer 160 is electrically connected to conductive layer 156 and operates as a second RDL for routing electrical signals from conductive layer 92 through TSV 150 to image sensor area 112 and the circuits on active surface 110 and active surface 90, as well as external to the package.

An insulating or passivation layer 162 is formed over insulating layer 158 and conductive layer 160 using PVD, CVD, printing, lamination, spin coating or spray coating. Insulating layer 162 contains one or more layers of SiO2, Si3N4, SiON, Ta2O5, Al2O3, solder resist, polyimide, BCB, PBO, polymer, or other material having similar insulating and structural properties. A portion of insulating layer 162 is removed by etching or LDA to expose conductive layer 160. Additional insulating layers such as 154, 158, and 162, and conductive layers such as 156 and 160, can be formed as multi-layered RDL build-up interconnect structure 168.

An electrically conductive bump material is deposited over conductive layer 160 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 170. In some applications, bumps 170 are reflowed a second time to improve electrical contact to conductive layer 160. In one embodiment, bumps 170 are formed over an under bump metallization (UBM) layer. Bumps 170 can also be compression bonded or thermos-compression bonded to conductive layer 160. Bumps 170 represent one type of interconnect structure that can be formed over conductive layer 160. The interconnect structure can also use conductive pillar, stud bump, micro bump, bond wires, conductive paste, or other electrical interconnect.

Figure 3J:
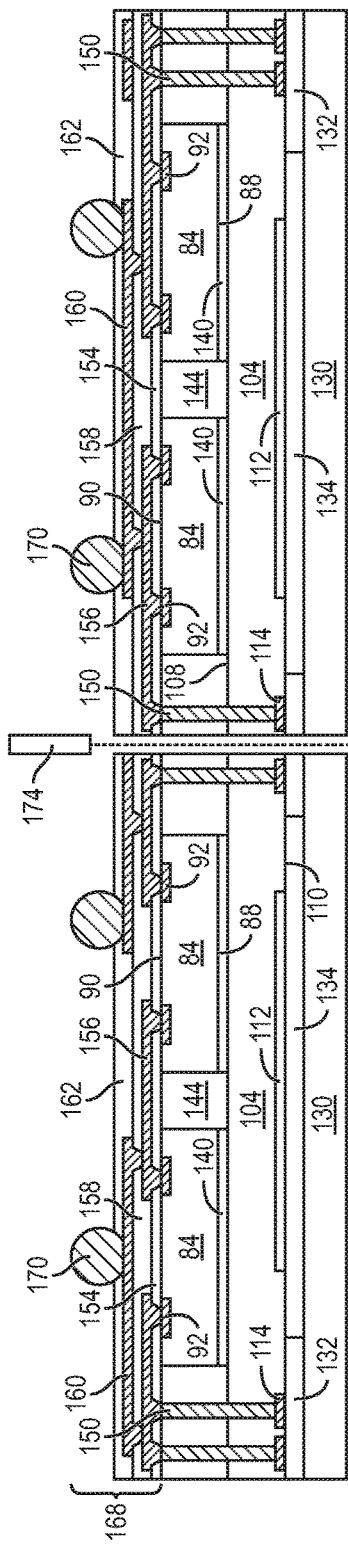

The wafer level processing as described in FIGS. 3a-3i improve manufacturing efficiency. In FIG. 3j, semiconductor wafer 100 is singulated through saw streets 106 with saw blade or laser cutting tool 174 or plasma etching process into individual semiconductor packages.

FIGS. 4a-4b illustrate another embodiment for forming the build-up interconnect structure. Continuing from FIG. 3h, an encapsulant 180 is formed over encapsulant 144 and active surface 90, as shown in FIG. 4a. A portion of encapsulant layer 180 is removed by etching or LDA to expose TSV 150 and conductive layer 92 on active surface 90. An electrically conductive layer 186 is formed on encapsulant layer 180 using PVD, CVD, electrolytic plating, electroless plating process, evaporation, or other suitable metal deposition process. Conductive layer 186 includes one or more layers of Al, Cu, Sn, Ni, Au, Ag, Ti, TiW, or other suitable electrically conductive material. Conductive layer 186 operates as a first RDL for routing electrical signals from conductive layer 92 through TSV 150 to image sensor area 112 and the circuits on active surface 110 and active surface 90, as well as external to the package.

An encapsulant layer 188 is formed over encapsulant layer 180 and conductive layer 186. A portion of encapsulant layer 188 is removed by etching or LDA to expose conductive layer 186. An electrically conductive layer 190 is formed on encapsulant layer 188 using PVD, CVD, electrolytic plating, electroless plating process, evaporation, or other suitable metal deposition process. Conductive layer 190 includes one or more layers of Al, Cu, Sn, Ni, Au, Ag, Ti, TiW, or other suitable electrically conductive material. Conductive layer 190 is electrically connected to conductive layer 186 and operates as a second RDL for routing electrical signals from conductive layer 92 through TSV 150 to image sensor area 112 and the circuits on active surface 110 and active surface 90, as well as external to the package.

An encapsulant layer 192 is formed over encapsulant layer 188 and conductive layer 190. A portion of encapsulant layer 192 is removed by etching or LDA to expose conductive layer 190. Additional encapsulant layers such as 180, 188, and 192, and conductive layers such as 186 and 190, can be formed as multi-layered RDL build-up interconnect structure 194.

An electrically conductive bump material is deposited over conductive layer 190 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 190 using a suitable attachment or bonding process. In one embodiment, the bump material is reflowed by heating the material above its melting point to form balls or bumps 196. In some applications, bumps 196 are reflowed a second time to improve electrical contact to conductive layer 190. In one embodiment, bumps 196 are formed over a UBM layer. Bumps 196 can also be compression bonded or thermos-compression bonded to conductive layer 190. Bumps 196 represent one type of interconnect structure that can be formed over conductive layer 190. The interconnect structure can also use conductive pillar, stud bump, micro bump, bond wires, conductive paste, or other electrical interconnect.

In FIG. 4b, semiconductor wafer 100 is singulated through saw streets 106 with saw blade or laser cutting tool 198 or plasma etching process into individual semiconductor packages.

Figure 5:
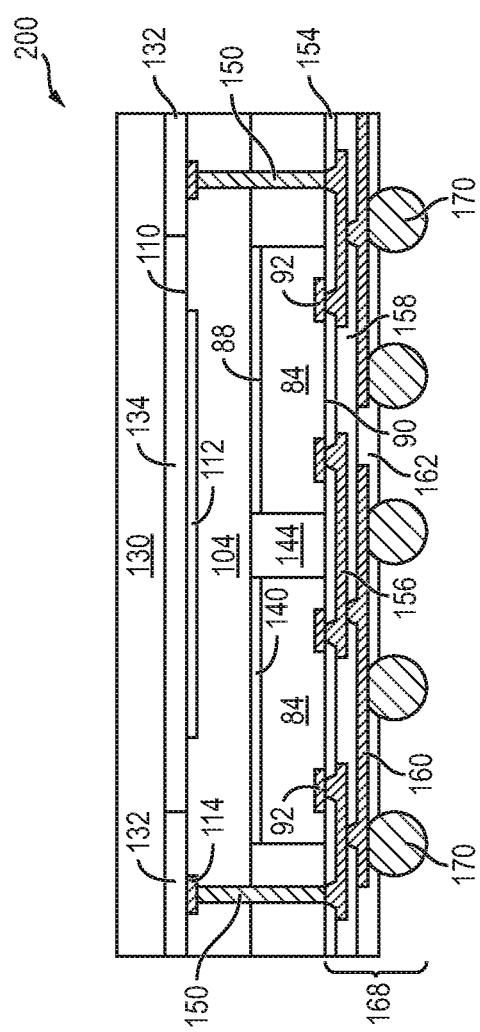
FIG. 5 illustrates the multi-die package with an image sensor.

FIG. 5 shows semiconductor package 200 post singulation. A portion of light transmissive wafer 130 is disposed over image sensor area 112 of semiconductor die 104. TSV 150 electrically connect image sensor area 112 and the conductive layers and circuits on active surface 110 of semiconductor die 104 to build-up interconnect structure 168 or 194 as formed over encapsulant 144 and active surface 90 of semiconductor die 84. The encapsulant in build-up interconnect structure 194 reduces stress for bumps 196. Semiconductor package 200 integrates semiconductor die 84 and semiconductor die 104 to enhance the image performance within the multi-die image sensor package. The electrical routing path between semiconductor die 84 and semiconductor die 104 is reduced to improve signal propagation timing, reduce noise, and provide higher quality image sensing.

Figure 6A:
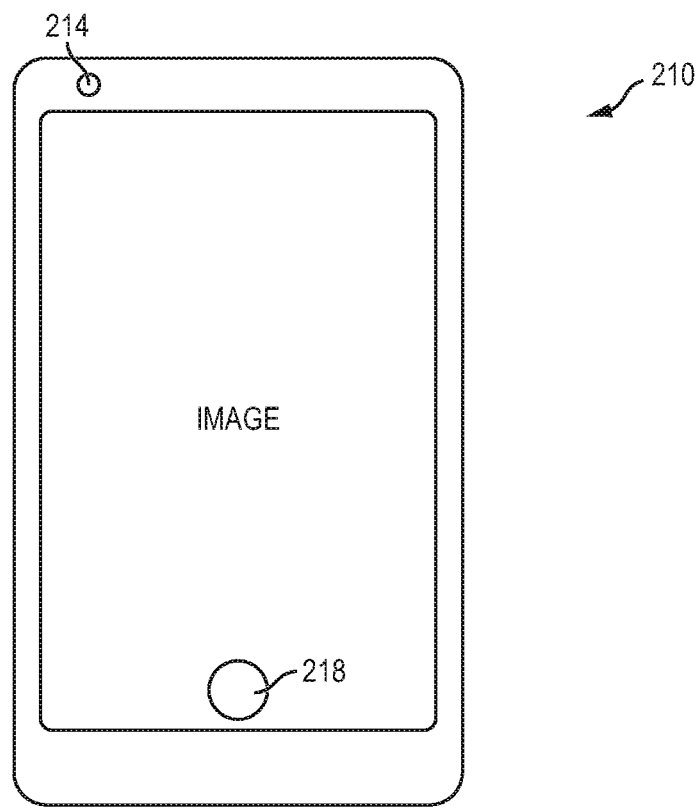
FIGS. 6a-6b illustrate an electronic device containing the multi-die package with an image sensor.
Figure 6B:
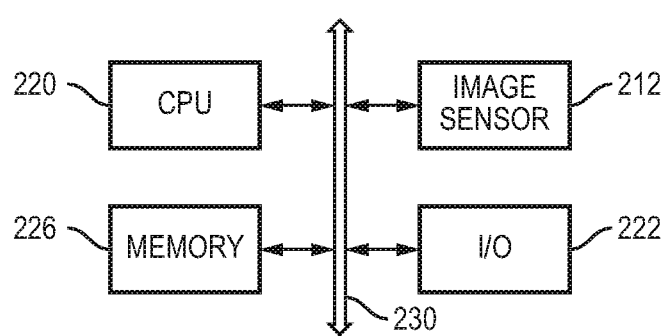

FIGS. 6a-6b show electronic device 210, such as a cellular phone with camera, which includes an image sensing device 212 implemented with semiconductor package 200, as described in FIGS. 1-5. FIG. 6a represents the cellular phone with camera. FIG. 6b is a functional block diagram of components within electronic device 210. Electronic device 210 includes lens 214 for focusing an image on the pixel array within image sensing device 212 when a shutter release button 218 is touched or pressed. In addition, electronic device 210 includes central processing unit (CPU) 220, such as a microprocessor, to control camera and image processing functions, input/output (I/O) device 222, and memory 226, which communicate with CPU 220 over bus 230.

While one or more embodiments have been illustrated and described in detail, the skilled artisan will appreciate that modifications and adaptations to those embodiments may be made without departing from the scope of the present disclosure.

What is claimed:

1. A method of making a semiconductor device including an image sensor, comprising:
   providing a semiconductor wafer including an image sensor area;
   disposing a light transmissive wafer over the semiconductor wafer;
   disposing a semiconductor die over a surface of the semiconductor wafer opposite the light transmissive wafer;
   depositing a first encapsulant around the semiconductor die; and
   forming an interconnect structure over the first encapsulant and semiconductor die, wherein forming the interconnect structure includes,
   (a) forming a first insulating layer over the first encapsulant and semiconductor die,
   (b) forming a first conductive layer over the first insulating layer,
   (c) forming a second insulating layer over the first insulating layer and first conductive layer, and
   (d) forming a second conductive layer over the first conductive layer and second insulating layer.

2. The method of claim 1, further including forming a conductive via through the semiconductor wafer and first encapsulant.

3. The method of claim 1, further including removing a portion of the semiconductor wafer.

4. The method of claim 1, further including removing a portion of the first encapsulant.

5. The method of claim 1, wherein the light transmissive wafer includes glass.

6. A method of making a semiconductor device including an image sensor, comprising:
   providing a semiconductor wafer including an image sensor area;
   disposing a light transmissive wafer over the semiconductor wafer;
   disposing a semiconductor die over a surface of the semiconductor wafer opposite the light transmissive wafer;
   depositing a first encapsulant around the semiconductor die; and
   forming an interconnect structure over the first encapsulant and semiconductor die, wherein forming the interconnect structure includes,
   (a) forming a second encapsulant over the first encapsulant and semiconductor die,
   (b) forming a first conductive layer over the second encapsulant,
   (c) forming a third encapsulant over the second encapsulant and first conductive layer, and (d) forming a second conductive layer over the first conductive layer and third encapsulant.

\* \* \* \* \*